United States Patent [19]

Stevens

[11] Patent Number: 5,192,990
[45] Date of Patent: Mar. 9, 1993

[54] OUTPUT CIRCUIT FOR IMAGE SENSOR

[75] Inventor: Eric G. Stevens, Rochester, N.Y.

[73] Assignee: Eastman Kodak Company, Rochester, N.Y.

[21] Appl. No.: 715,865

[22] Filed: Jun. 17, 1991

Related U.S. Application Data

[63] Continuation of Ser. No. 315,367, Feb. 24, 1989, abandoned, which is a continuation of Ser. No. 65,686, Jun. 23, 1987, abandoned, which is a continuation of Ser. No. 908,851, Sep. 18, 1986, abandoned.

[51] Int. Cl.$^5$ .................... H01L 29/7; H01L 29/10; H01L 29/86
[52] U.S. Cl. .................... 257/229; 377/60; 257/231; 257/242; 257/336; 257/403; 257/408; 257/218; 257/222; 257/239
[58] Field of Search .................... 357/24, 24 M, 24 L, 357/24 R, 41, 23.12; 377/60, 61, 62, 63, 23.4

[56] References Cited

U.S. PATENT DOCUMENTS 4,574,295 3/1986 Tanikawa et al. .
4,811,371 3/1989 Tower .................... 357/24

FOREIGN PATENT DOCUMENTS 59-65470 4/1984 Japan .

Primary Examiner—Andrew J. James
Assistant Examiner—Ngan Van Ngo
Attorney, Agent, or Firm—Raymond L. Owens

[57] ABSTRACT

An output circuit for sequentially receiving and converting charge collected in the photoelements of an image sensor and converting such charge into an output voltage. The output circuit includes a buried-channel LDD transistor having gate, source and drain electrodes. The source electrode provides a floating diffusion. When the transistor is turned off, a potential well is provided in the floating diffusion which collects charge. An output source-follower amplifier also employing buried-channel LDD transistors is connected to the floating diffusion and produces the output voltage.

30 Claims, 4 Drawing Sheets

OUTPUT CIRCUIT FOR IMAGE SENSOR

This is continuation of application Ser. No. 315,367, filed Feb. 24, 1989, now abandoned, which is a continuation of application Ser. No. 065,686, filed Jun. 23, 1987, now abandoned, which is a continuation of application Ser. No. 908,851, filed Sep. 18, 1986, now abandoned.

BACKGROUND OF THE INVENTION

1. Field of the Invention

The present invention relates to output circuits for sequentially receiving and then converting charge collected in the photoelements of an image sensor into an output voltage.

2. Description of the Prior Art

The resolution of image sensors is increased by increasing the number of photoelements of such sensors. As the number of photoelements increases, their size necessarily decreases for a given sensor image area. Charge is collected by these photoelements and transferred to an output circuit which includes a floating diffusion (FD). This output circuit is adapted to convert charge into an output voltage. As the size of sensor elements decreases, the number of signal charge they collect also decreases. Unfortunately, the portion of the output signal caused by noise actually increases. Noise therefore becomes a more significant component of any output signal. Consider that we have a given photoelement signal charge ($Q_{sig}$) as determined by its responsivity and signal exposure level. Such charge is independent of the sense node's capacitance ($C_{FD}$). Also consider that the source-follower output circuit as described herein has a given input-referred noise voltage ($\overline{V_{iSF}^2}$) primarily due to thermal noise of the first-stage drive transistor. Thermal noise is also independent of $C_{FD}$ for a given transistor width-to-length ratio (W/L) as determined by drive requirements. ($\overline{V_{iSF}^2}$) can be converted to an input-referred noise in terms of charge by the expression, $$\overline{Q_{iSF}^2} = C_{FD}^2 \overline{V_{iSF}^2}.$$

Another noise term associated with the described output circuit is termed reset or kTC noise, and is given in terms of charge by the expression, $$\overline{Q_{kTC}^2} = kTC_{FD},$$

where k is Boltzman's constant and T is the temperature. Therefore the signal-to-noise ratio (S/N) is given by, $$S/N = \frac{Q_{sig}}{\sqrt{kTC_{FD} + C_{FD}^2 \overline{V_{iSF}^2} + \text{other terms}}},$$

where the other terms are also independent of $C_{FD}$. From this expression, it can be seen that the signal-to-noise ratio is improved by decreasing $C_{FD}$.

It is therefore an object of the present invention to provide a highly-sensitive floating-diffusion electrometer design which minimizes input capacitance and thereby reduces noise in the total output signal voltage.

SUMMARY OF THE INVENTION

This object is achieved by an output circuit for sequentially receiving charge and converting such charge collected in the photoelements of an image sensor into output voltages, comprising:

a. a first buried-channel LDD transistor having gate, source and drain electrodes, the source electrode provides a floating diffusion; means for selectively applying pulses to the gate electrode of said first transistor to effect the operating characteristics of said first transistor to create a potential well in such floating diffusion preparing it to receive charge;

b. an output source-follower amplifier having a second buried-channel LDD transistor electrically connected to said floating diffusion, said source-follower amplifier producing an output voltage in response to charge collected in such floating diffusion.

Among the features of this integrated-output circuit are that it has low-power dissipation, requires very little surface area and is quite versatile.

This circuit reduces noise in the output voltage through high input-referred sensitivity and also increases reliability and simplicity of overall system design. MOS transistors are particularly suitable for use in the present invention.

For convenience of illustration, none of the drawings are to scale.

DESCRIPTION OF THE PREFERRED EMBODIMENT

Figure 1:
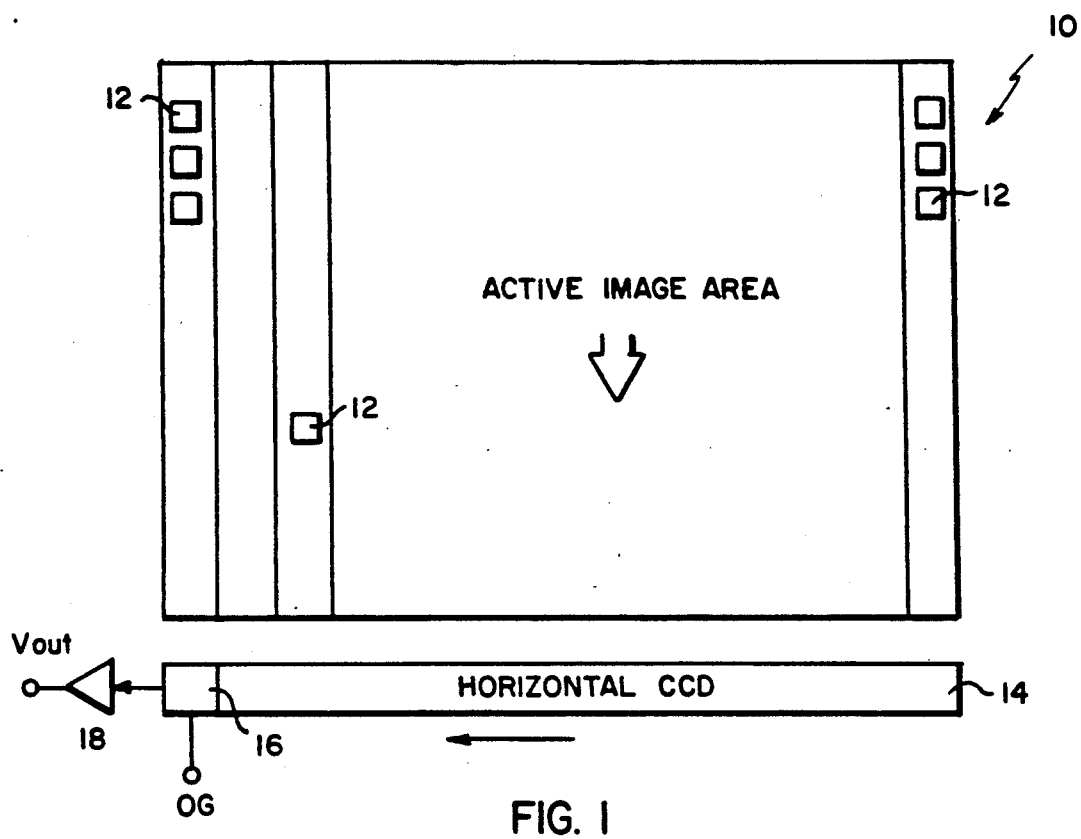
FIG. 1 is a block diagram of the basic elements of an image sensor in accordance with the present invention.

Turning first to FIG. 1, there is shown in block diagrammatic form a full-frame image sensor 10. The image sensor 10 includes photoelements 12 which collect charge as a linear function of the intensity of incident light and integration time, and as a non-linear function of incident light wavelength. Each photoelement represents one pixel of an image scene. These photoelements can for example be photocapacitors which accumulate electrons in an n region of a buried channel. During readout, charge is transferred vertically from photocapacitor to photocapacitor in each column to a buried-channel horizontal charge-coupled device (CCD) 14. A portion of the charge-coupled device is shown in more detail in FIG. 4. Each packet of electrons from each photoelement is sequentially delivered to a horizontal CCD element preceding an output gate 16 and then from this element through the output gate to an output circuit 18. The output circuit 18 is integrated on the same chip as the sensor 10. The output circuit 18 provides an output voltage $V_{out}$ proportional to each packet of electrons (charge) it receives. The output circuit 18 includes a floating diffusion 35 (FD) which, as will be seen, has its effective capacitance minimized to reduce noise in the output signal.

Figure 2:
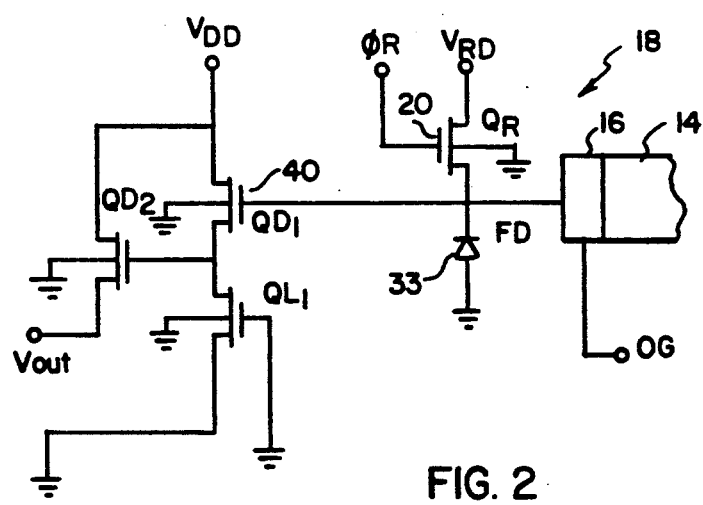
FIG. 2 shows in schematic form the output circuit 18 shown in FIG. 1.
Figure 4:
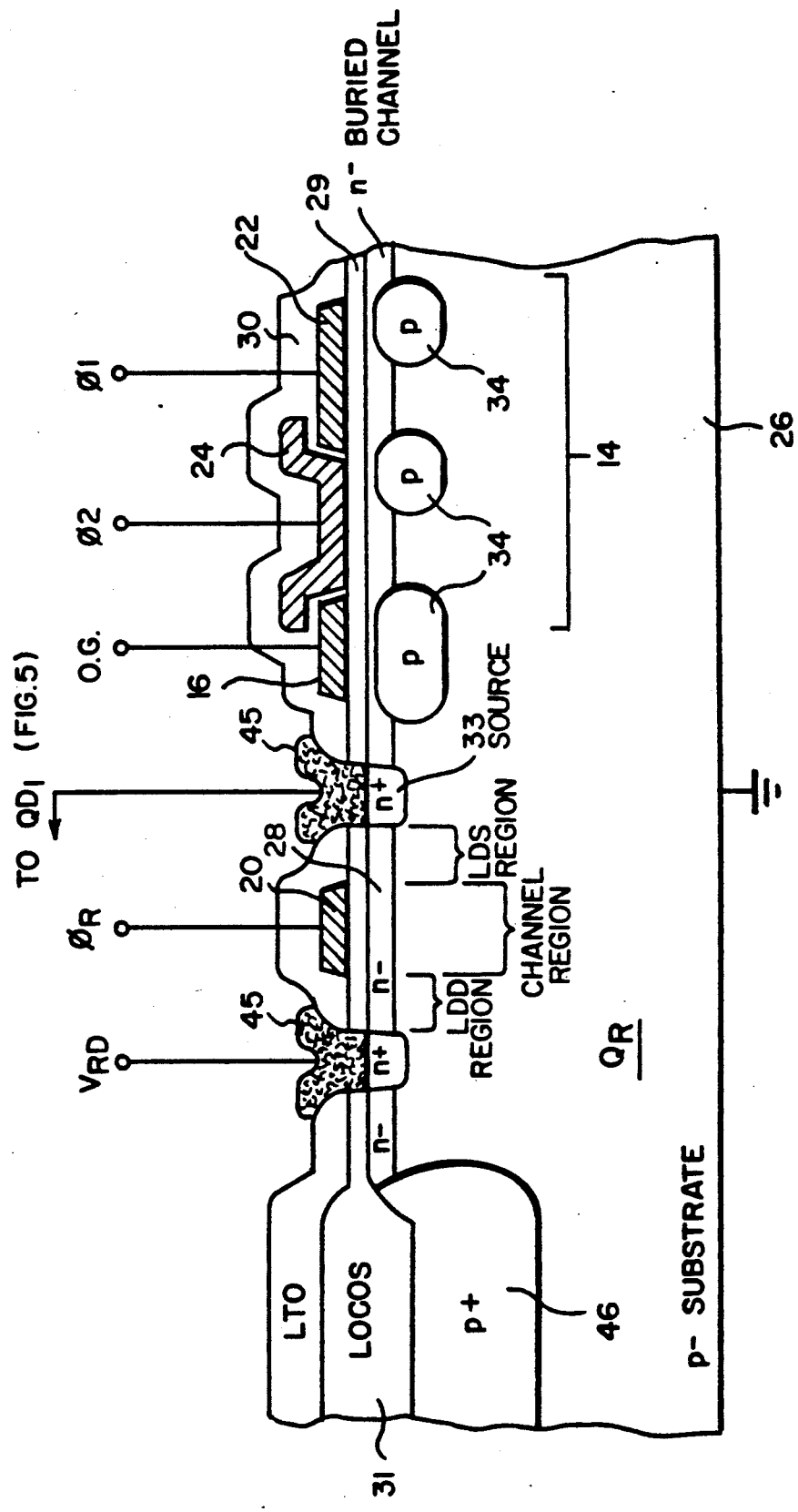
FIG. 4 is a sectional view taken along the lines A—A of FIG. 3.
Figure 5:
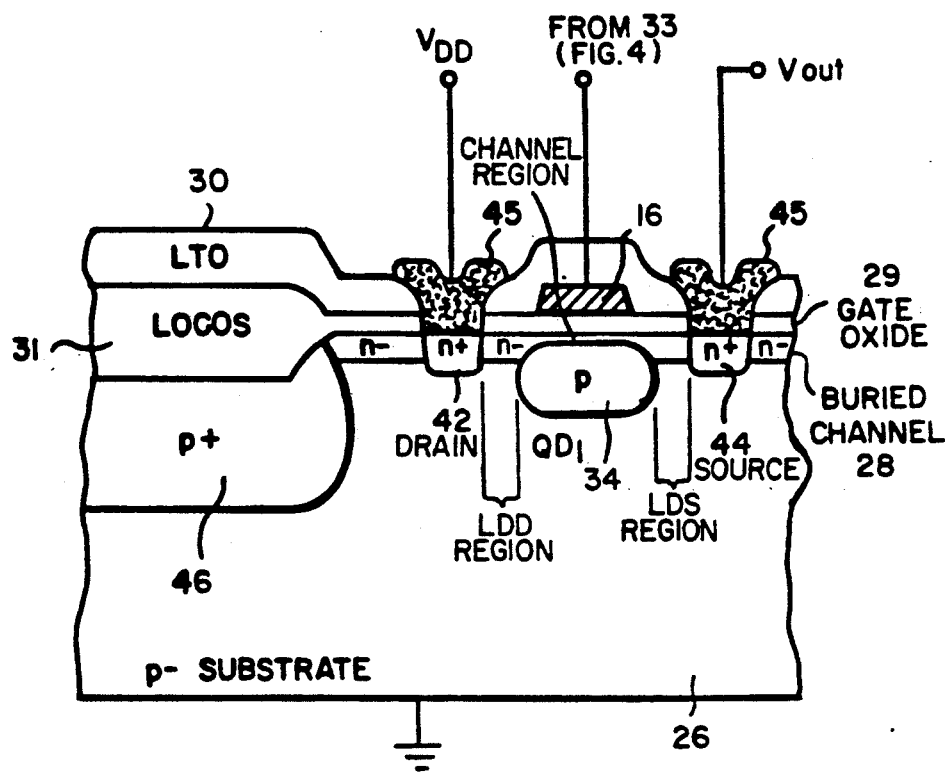
FIG. 5 is a sectional view taken along the lines B—B of FIG. 3.

Turning now to FIG. 2, the circuit 18 is shown in schematic form. In response to the removal of the pulse ΦR applied to the gate electrode 20 of a reset transistor $Q_R$, the transistor $Q_R$ is turned off and shortly thereafter, charge is transferred from under the output gate 16 to a floating diffusion FD, 33. As shown in FIG. 4, the floating diffusion is actually the source electrode 33 of the transistor $Q_4$. When the pulse ΦR is applied, the transistor $Q_R$ is turned on and the potential across the floating diffusion FD is returned to a reference level set by $V_{RD}$, the reset drain potential. When transistor $Q_R$ is off, a potential well is created in the floating diffusion. Electrons are once again transferred to this potential well from the output gate 16. The floating diffusion 33 is electrically connected to the gate electrode of a transistor $QD_1$ of the first stage of the source-follower output amplifier 18. In this first stage, there are two transistors $QD_1$ and $QL_1$. Both these transistors continuously operate in a saturated mode. At the electrical junction of the transistors $QD_1$ and $QL_1$, a voltage is produced which follows the voltage level across the floating diffusion FD. This voltage is applied as an input to the gate electrode of transistor $QD_2$. The drain of $QD_2$ is connected to the same potential source $V_{dd}$ which is coupled to the drain of transistor $QD_1$. All of the transistors, $Q_R$, $QD_1$, $QL_1$ and $QD_2$ are NMOS lightly-diffused drain (LDD) buried-channel transistors. In FIGS. 4 and 5, LDD transistors are shown. The source and drain electrodes are heavily-doped n+, the channel region is under the gate electrode. Lightly-doped (n−) source and drain (LDD and LDS) respectively connect the source and drain electrodes to the channel. The gate doesn't overlie the LDD and LDS regions. Transistor $QD_1$ is shown in section in FIG. 5. The output voltage $V_{out}$ is taken from the source electrode of transistor $QD_2$. $V_{out}$ is applied as an input to conventional off-chip signal processing circuitry.

Figure 3:
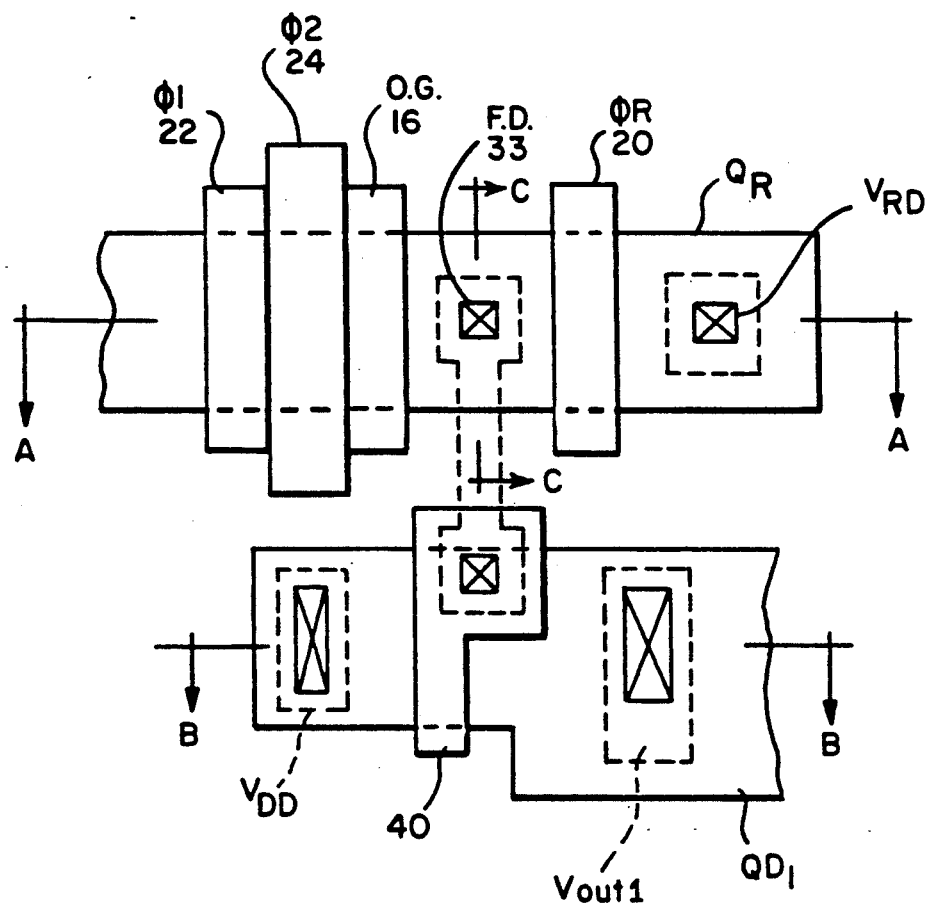
FIG. 3 is a top view showing the layout of portions of the output circuit 18.

FIG. 3 shows a top layout view of transistor $Q_R$ and transistor $QD_1$ of the first stage of the source-follower output amplifier 18. FIG. 3 should be consulted during the description of FIGS. 4 and 5. Turning now to FIG. 4 where there is shown in cross-section the reset transistor $Q_R$ and the output gate 16 and two gates of the horizontal CCD 14. The CCD 14 is shown as a two-phase device. There are two levels of polysilicon, poly-1 and poly-2 which respectively provide shift register gate electrodes 22 and 24. A substrate 26 is of a p-type conductivity and an n-type layer 28, which can be provided by implanting arsenic into the substrate 26, provides a buried-channel structure. Directly over the n-type layer 28 is a layer of thermally grown silicon dioxide 29. Directly over the p-type substrate 26 is a p+ field threshold adjust implant 46 in the non-active regions of the device. Over the P+ field threshold adjusted regions 46 is a thick field silicon dioxide layer 31 provided by a conventional LOCOS (Local Oxidation of Silicon) process.

CCD shift register electrodes 22 and 24 are formed on the thin gate oxide 29. Separating each of the electrodes is an insulating layer 30 of silicon dioxide which is provided by a conventional LTO (Low Temperature Oxide). The output gate 16 has a positive potential $V_{OG}$ continuously applied to the electrode. If we assume that electrons are held under the last gate 24 of the horizontal shift CCD 14 and that at this time the gate potential $\phi_2$ is reduced while the gate potential $\phi_1$ is raised, the electrons will flow down a "potential hill" under the output gate 16 to the floating diffusion 33. At this time, the transistor $Q_R$ is off; that is, signal electrons collect on the source electrode 33. The transistor $Q_R$ is an NMOS LDD buried-channel transistor. The source electrode 33 provides the function of a floating diffusion FD. The electrode 33 is a floating diffusion because the potential developed across it is allowed to float when the transistor $Q_R$ is off. The floating diffusion is provided at the PN junction between the n+ diffused electrode and p (substrate) regions. Then when the pulse ΦR is applied to the gate electrode 20 of transistor $Q_R$, the transistor $Q_R$ turns on and the potential across the floating diffusion 33 is reset by the electrons draining off onto the drain of transistor. $Q_R$ which is at a potential $V_{RD}$. During these times, a voltage change is produced across the floating diffusion which is electrically connected to the gate electrode 40 of transistor $QD_1$ shown in FIGS. 2 and 5. As shown in FIG. 5, transistor $QD_1$ is also an NMOS LDD buried-channel transistor.

Figure 6:
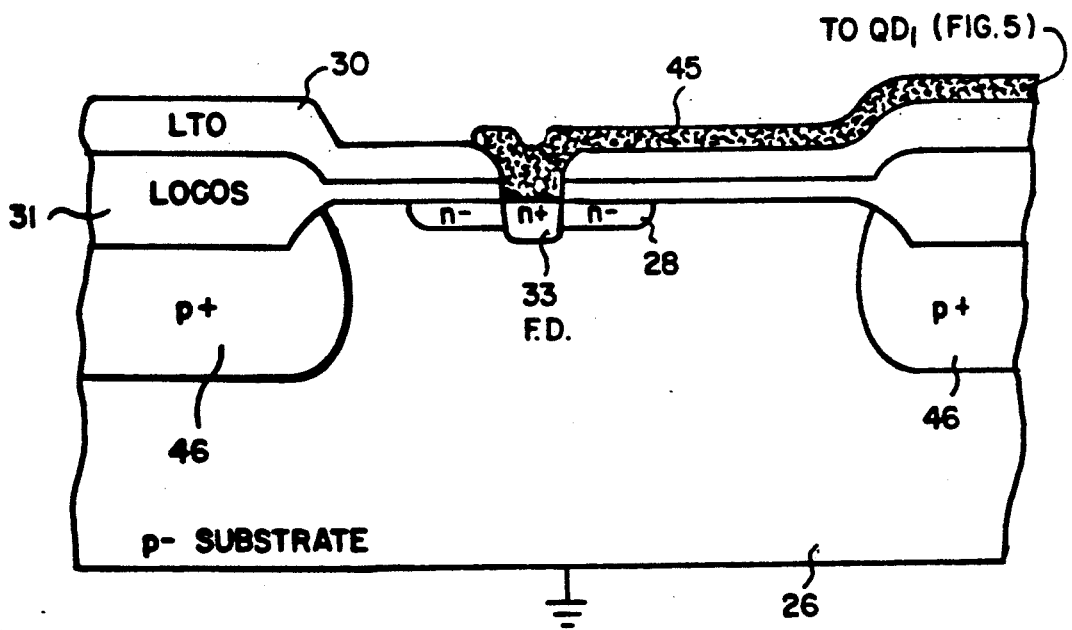
FIG. 6 is a sectional view taken along the lines C—C of FIG. 3.

The transistor $Q_R$, $QD_1$, $QL_1$ and $QD_2$ are constructed by defining the active and field regions through a conventional LOCOS process. All these transistors are formed by implanting arsenic to form the buried-channel layer 28. By using buried-channel transistors, as opposed to surface-channel transistors, the flicker noise component of the transistors is reduced since the carriers do not interact as strongly with silicon-silicon dioxide interface states. This buried-channel implant layer 28 also serves to replace the n− source and drain implanted regions typically used to form LDD NMOS-FETs thereby simplifying the process. In accordance with the invention, the use of an LDD structure which has the n− layer 28 connected to n+ source and n+ drain electrodes as shown, causes the gate-to-source and drain overlap capacitances to be greatly reduced. This capacitance makes up part of the total capacitance at the sensing node FD 33. In addition, the n− buried-channel layer 28 is separated from the p+ field implanted regions 46 at the source node 33 of QR which forms the floating diffusion as shown in FIG. 6. This serves to reduce the floating diffusion's sidewall junction capacitance, and hence the total capacitance of the sensing node FD, since the depletion spreading is increased. A boron FET threshold voltage adjust implant 34 is implanted through the gate electrodes for the following elements: $QD_1$ (see FIG. 5), $QL_1$, $QD_2$ and OG. A number of conventional processes can be used to provide these implants 34. A particularly suitable process is described in commonly assigned U.S. patent application Ser. No. 750,204, filed Jul. 1, 1985, entitled "Method of Making Edge-Aligned Implants and Electrodes Therefor" in the names of Losee and Lavine. The disclosure of this application is incorporated by reference herein. The n+ source and n+ drain electrodes of the transistors have been constructed by implanting arsenic though source and drain contact holes etched through the overlaying LTO layer 30 into layer 28. This saves a masking step hence simplifying the construction of these electrodes, and results in the n+ contacts being self-aligned. This also stops the n+ source and drain regions from spreading beneath the polysilicon gates (see FIGS. 4 and 5), by lateral diffusion thereby greatly reducing the overlap capacitance. Aluminum contacts 45 are sputtered into the etched holes to make electrical connection with the electrodes. Since the n+ source/drain regions are also separated from the p+ field or channel stop regions 46 (see FIGS. 5 and 6), the capacitance of the reverse biased junctions is also reduced due to an increased depletion region width. An added advantage of separating the n+ regions off of the p+ regions is an increase of the diode's reverse-bias breakdown voltage.

FIG. 5 will now be described. The NMOS LDD buried-channel transistor QD$_1$ includes a drain electrode 42 and a source electrode 44. A p+ region 46 provides a field threshold adjust function. It will be understood that a lightly-doped p region 34 may be provided just under the layer 28 to adjust the threshold voltage of the transistor as discussed above in connection with QD$_1$. This P region 34 can be provided by conventional boron ion implantation.

It has also been found quite advantageous to have transistors QL$_1$ and QD$_2$ as NMOS LDD buried-channel transistors, which increase speed by reducing the capacitive load seen at the output of the first-stage source-follower.

The effective floating diffusion capacitance is reduced for three reasons. The first is by reducing the gate-to-drain and source overlap capacitance since the n+ regions are offset far enough from the gate so that it will not diffuse laterally underneath the gate. This reduction is effected through the use of the LDD structure. The second reduction in capacitance is effected by the separation of the n+ floating diffusion region from the p+ field threshold adjust regions. The third reduction in effective floating diffusion capacitance results from separating the CCD buried-channel n− region 28 at the floating diffusion from the p+ field threshold adjust regions 46 as shown in FIG. 6. This causes a larger depletion region of this reverse biased junction which results in a lower junction capacitance.

In accordance with this invention, an output circuit was constructed in accordance with the present invention using four buried-channel NMOS, LDD transistors. Each of these transistors employed self-aligned n+ contacts. By means of this arrangement, an effective floating diffusion capacitance of approximately 10 fF was obtained. The circuit provided low-flicker noise with a relatively high output voltage. Flicker noise was reduced by using buried-channel transistors.

The invention has been described in detail with particular reference to a certain preferred embodiment thereof, but it will be understood that variations and modifications can be effected within the spirit and scope of the invention.

I claim:

1. An output circuit for sequentially receiving charge and converting such charge collected in photoelements of an image sensor into an output signal which contains noise, said circuit comprising:
   a. a first MOS transistor having a gate electrode, a channel region under the gate electrode, and source and drain electrodes, said source electrode having a highly doped region spaced from the channel region and a more lightly doped region between the highly doped region and the channel region to provide a floating diffusion with reduced capacitance;
   b. means for selectively applying pulses to the gate electrode of said first transistor to reset the potential across said floating diffusion and prepare it to receive charge produced in a photoelement; and
   c. an output source-follower amplifier having a second transistor, a gate of which is electrically connected to said floating diffusion, whereby said amplifier produces a change in output voltage in response to charge collected in said floating diffusion with an improved signal to noise ratio.

2. The output circuit as set forth in claim 1 wherein said output source-follower amplifier is a two-stage configuration including said second transistor in the first stage.

3. An output circuit for sequentially receiving charge and converting such charge collected in photoelements of an image sensor into an output signal which contains noise, said circuit comprising:
   a. a first transistor having a gate electrode, a channel region under the gate electrode, and source and drain electrodes, said source electrode providing a floating diffusion with reduced capacitance;
   b. means for selectively applying pulses to the gate electrode of said first transistor to effect the operating characteristics of said first transistor to reset the potential across the floating diffusion preparing it to receive charge produced in a photoelement;
   c. an output source-follower amplifier having a second transistor, a gate of which is electrically connected to said floating diffusion, whereby said amplifier produces a change in output voltage in response to charge collected in said floating diffusion with an improved signal to noise ratio; and
   d. said second transistor comprises a substrate, a channel region in the substrate, an insulating layer on the channel region, a gate electrode on said insulating layer and over the channel region, and highly doped source and drain electrodes in the substrate and each spaced from the channel region by a more lightly doped regions.

4. The output circuit as set forth in claim 1 wherein the first MOS transistor comprises a buried-channel MOS transistor.

5. The output circuit as set forth in claim 4 in which the buried-channel of the first MOS transistor is a more lightly doped region spaced from the source electrode.

6. The output circuit as set forth in claim 5 in which the more lightly doped region between the source and the channel region is an extension of the channel region.

7. The output circuit as set forth in claim 1 further comprising a highly doped field threshold adjust region around the first MOS transistor with the lightly doped region adjacent the floating diffusion being spaced from the threshold adjust region.

8. The output circuit as set forth in claim wherein the second transistor is a MOS transistor comprising a gate electrode, a channel region under the gate electrode, highly doped source and drain regions at opposite sides of the channel region and a more lightly doped region between the highly doped drain region and the channel region of the second transistor.

9. The output circuit as set forth in claim 8 wherein the second MOS transistor comprises a buried-channel MOS transistors.

10. The output circuit as set forth in claim 9 in which the buried-channel of the second MOS transistor is a more lightly doped region spaced from the drain electrode.

11. The output circuit as set forth in claim 10 in which the more lightly doped region between the drain and the channel region of the second MOS transistor is an extension of the channel region.

12. The output circuit as set forth in claim 3 wherein the second transistor comprises a buried-channel MOS transistor.

13. The output circuit as set forth in claim 12 in which the buried-channel of the second transistor is a lightly doped region spaced from the source and drain electrodes.

14. The output circuit as set forth in claim 13 in which the drain electrode of the second MOS transistor is spaced from the lightly doped channel region by a lightly doped region which is an extension of the lightly doped channel region.

15. The output circuit as set forth in claim 3 in which the image sensor comprises a horizontal charge-coupled device to which the photoelements are connected, the charge-coupled device comprises an output gate and a channel region under the output gate, and means connecting the floating diffusion to the channel region of the horizontal charge-coupled device.

16. The output circuit as set forth in claim 15 in which the means connecting the floating diffusion to the channel region of the charge-coupled device comprises a lightly doped region extending between the floating diffusion and the channel region of the charge-coupled device.

17. The output circuit as set forth in claim 16 in which the channel region of the charge-coupled device is a lightly doped region.

18. An image sensor comprising:
a substrate of a semiconductor material having a surface;
a plurality of photoelements in said substrate and extending to the surface thereof;
a horizontal charge-coupled device in the substrate and extending to the surface to which the photoelements are connected and having an output gate and a channel region under the output gate;
an output circuit connected to the channel region under the output gate, the output circuit comprising:
a first MOS transistor having spaced source and drain regions in the substrate and extending to the a gate electrode over and insulated from the surface of the substrate and between the source and drain regions, and a channel region in the substrate under the gate electrode, the source region having a highly doped region in the substrate and spaced from the channel region and a more lightly doped region in the substrate between the highly doped region and the channel region to provide a floating diffusion with reduced capacitance; and
means connecting the floating diffusion to the channel region under the output gate of the horizontal charge-coupled device.

19. The image sensor as set forth in claim 18 in which the means connecting the floating diffusion to the channel region under the output gate comprises a lightly doped region in the substrate and extending to the surface and extending between the floating diffusion and the channel region under the output gate.

20. The image sensor as set forth in claim 19 in which channel region of the horizontal change-coupled device is a lightly doped region in the substrate and extending to the surface.

21. The image sensor as set forth in claim 19 further comprising an output source-follower amplifier comprising a second transistor having a gate that is electrically coupled to the floating diffusion such that the amplifier produces a change in output voltage in response to charge collected in the floating diffusion with noise in such output voltage being reduced.

22. The image sensor as set forth in claim 21 wherein the second transistor is a MOS transistor comprising a gate electrode, a channel region under the gate electrode, highly doped source and drain regions at opposite sides of the channel region and a more lightly doped region between the highly doped drain region and the channel region of the second transistor.

23. The image sensor as set forth in claim 18 wherein the first MOS transistor comprises a buried-channel MOS transistor.

24. The image sensor as set forth in claim 23 in which the buried-channel of the first MOS transistor is a region in the substrate the surface which is more lightly doped than the highly doped portion of the source electrode.

25. The image sensor as set forth in claim 24 in which the more lightly doped region between the source and the channel region is an extension of the channel region.

26. The image sensor as set forth in claim 18 further comprising a highly doped field threshold adjust region in the substrate at the surface and around the first MOS transistor, and the lightly doped region adjacent the floating diffusion is spaced from the threshold adjust region.

27. The image sensor as set forth in claim 18 further comprising an output source-follower amplifier comprising a second transistor having a gate that is electrically coupled to the floating diffusion such that the amplifier produces a change in an output signal which contains noise in response to charge collected in the floating diffusion with an improved signal to noise ratio.

28. The image sensor as set forth in claim 27 wherein the second transistor comprises a lightly doped channel region, an insulating layer over the channel region, a gate electrode on the insulating layer, highly doped source and drain electrode regions and a lightly doped regions between the highly doped drain regions and the channel region.

29. An image sensor comprising:
a substrate of a semiconductor material having a surface;
a plurality of photoelements in said substrate and extending to the surface thereof;
a horizontal charge-coupled device in the substrate and extending to the surface to which the photoelements are connected and having an output gate and a channel region under the output gate;
an output circuit connected to the channel region under the output gate, the output circuit comprising:
a first MOS transistor having spaced source and drain region in the substrate and extending to the surface, a gate electrode over and insulated from the surface of the substrate and between the source and drain region, and a channel region in the substrate under the gate electrode, the source region having a highly doped region in the substrate to provide a floating diffusion; and
a lightly doped region in the substrate and extending to the surface and extending between the floating diffusion and the channel region under the output gate to connect the floating diffusion to the channel region under the output gate of the horizontal charge-coupled device.

30. The image sensor as set forth in claim 29 further comprising an output source-follower amplifier comprising a second transistor having a gate that is electrically coupled to the floating diffusion such that the amplifier produces a change in an output signal which contains noise in response to charge collected in the floating diffusion with an improved signal to noise ratio.

* * * * *